United States Patent [19]

Anderson et al.

[11] Patent Number: 5,719,605
[45] Date of Patent: Feb. 17, 1998

[54] LARGE ARRAY HEATER CHIPS FOR THERMAL INK JET PRINTHEADS

[75] Inventors: Frank Edward Anderson, Sadieville; Paul Albert Cook; Anna Catherine Cramer, both of Lexington, all of Ky.

[73] Assignee: Lexmark International, Inc., Lexington, Ky.

[21] Appl. No.: 752,091

[22] Filed: Nov. 20, 1996

[51] Int. Cl.⁶ .................. B41J 2/05; H01L 21/00
[52] U.S. Cl. .................. 347/59; 347/63; 216/27; 438/21
[58] Field of Search .................. 347/47, 59, 63, 347/65; 216/27; 438/21

[56] References Cited

U.S. PATENT DOCUMENTS

| | | | |
|---|---|---|---|
| 4,047,184 | 9/1977 | Bassous et al. | 216/27 |
| 4,829,324 | 5/1989 | Drake et al. | 346/140 R |
| 4,851,371 | 7/1989 | Fisher et al. | 438/21 |
| 5,041,190 | 8/1991 | Drake et al. | 156/647 |
| 5,057,854 | 10/1991 | Pond et al. | 346/140 R |
| 5,160,403 | 11/1992 | Fisher et al. | 438/21 |
| 5,160,945 | 11/1992 | Drake | 346/140 R |
| 5,218,754 | 6/1993 | Rangappan | 29/611 |
| 5,278,584 | 1/1994 | Keefe et al. | 347/63 |
| 5,410,340 | 4/1995 | Drake et al. | 347/62 |
| 5,504,507 | 4/1996 | Watrobski et al. | 347/19 |
| 5,648,806 | 7/1997 | Steinfield et al. | 347/87 |
| 5,680,702 | 10/1997 | Kataoka | 29/890.1 |

*Primary Examiner*—Stuart N. Hecker
*Attorney, Agent, or Firm*—Ronald K. Aust

[57] ABSTRACT

An increased resolution thermal ink jet printhead construction and method for forming large array heater chips for thermal ink jet printheads is achieved by fabricating a unitary "megachip" in which multiple cells of electrical components are defined in a plurality of columnar patterns in a plane of a silicon wafer. Cells of a first column are vertically offset from cells of an adjacent column so as to overlap the gap between cells in the first column. The megachip is then formed by grouping at least one cell from each of two adjacent columns and dicing the wafer to remove the megachip.

19 Claims, 9 Drawing Sheets

LARGE ARRAY HEATER CHIPS FOR THERMAL INK JET PRINTHEADS

FIELD OF THE INVENTION

The present invention relates to ink jet printers, and more particularly, relates to increased resolution thermal ink jet printhead construction and a method for forming the same.

DESCRIPTION OF RELATED ART

The present invention is advantageously employed in an ink jetting method which employs kinetic energy for ejecting ink droplets by transferring thermal energy into the ink. In this method, a rapid volumetric change occurs in the ink resulting from a liquid to vapor transition of the ink caused by the thermal energy. As a result, an ink droplet is ejected from an ejection outlet (nozzle) formed in a recording head, thereby creating an ink droplet. The ink receiving, or recording medium, is placed close to the nozzle, and the ejected droplet contacts the surface of the recording medium to establish information recording.

A recording head, or printhead, used in the above described ink ejecting method, in general, has the ink ejection outlet or nozzle for ejecting ink droplets and an ink liquid passage which communicates with the ink ejection outlet which includes an electro-thermal converting element for generating the thermal energy. The electro-thermal converting element includes a resistance layer or resistor for heating by applying a voltage between two electrodes in the resistive material. In this type of printhead, forces are applied into the ink in the ink liquid passage, which are induced by capillary action, pressure drops or the like, and are balanced so that a meniscus is formed in the liquid passage adjacent to the ink ejection outlet. Every time an ink droplet is ejected, by means of the above mentioned energy applied to the ink, ink is drawn into the ink passage and a meniscus is formed again in the ink passage adjacent the ink ejection outlet.

Thermal ink jet heater chips, or dies, are conventionally formed with active semiconductor devices in silicon. The heater silicon chips include arrays of resistive and active elements oriented both horizontally and vertically that, in conjunction with mating nozzle plates, form nozzles for thermal ejection of ink drops. Depending upon the physical orientation of the nozzle plate relative to the print receiving medium, (e.g. paper), the vertical height or extent, diameter of the nozzles and spacings between nozzles determine the vertical size of the print swath and the horizontal width and spacing determine the packing density and firing rate ability of the printhead. As printing speeds and resolution density increase, larger and larger arrays of elements are required. These arrays can be formed by installing multiple elements of smaller die on a TAB (Tape Automated Bonding) media. However, individual die mounting tolerances are difficult to maintain. Alternatively, many hundreds of elements may be placed on a single, very large chip but with commensurate lower yields in manufacturing. This shortcoming has been recognized by the prior art, such as U.S. Pat. No. 5,218,754. This patent suggests the possibility of making heater chips longer. Typically, the yield goes down with longer chips, and therefore, it is desirable to make a plurality of smaller chips, which have less chance of containing defective heating elements, and abut them together. As may be imagined, however, difficulties in multiple chip alignment increase as the number of chips in an ink jet printhead increases. This alignment problem is avoided in the present invention by clustering banks or cells composed of arrays of heaters and nozzles on a single die, or chip.

Present ink jet heater array silicon wafer processes form single bank or cells on a die or chip having a single active and passive pattern thereon for mating with an associated nozzle plate. Prior to dicing and separation from the silicon wafer, these chips are tested and defective ones are marked to indicate that they should not be used. Yield studies of the locations for good and bad banks or cells indicate that most bad banks are adjacent the outer periphery of the wafer and that the highest yield banks are on the interior of the wafer.

SUMMARY OF THE INVENTION

The present invention is related to a high yield, low cost, very large array nozzle heater chip ("megachip or die") for ink jet printheads, and a method of fabricating the same, in which hundreds of heater elements are constructed in single chip multiple element array with precision relative positioning tolerances, and which produces a high yield from each wafer.

Furthermore, the present invention provides a method to accommodate both high and low end ink jet market needs with a common process using a single array geometry to form multiple banks of heater/nozzles on a common silicon wafer process line.

A preferred method of the invention for manufacturing chips for use in ink jet printheads includes the steps of processing a silicon wafer to establish a plurality of individual cells having electrical components formed therein, defining a first die having multiple cells in at least a high yield portion of the silicon wafer; defining at least a second die in a portion of the silicon wafer, wherein the second die has a quantity of cells different from the number of cells included in the first die; and dicing the wafer to separate the respective dies from the remainder of the silicon wafer.

A preferred ink jet printhead of the invention includes a unitary megachip having a plurality of cells and a layer forming a plurality of ink chambers, wherein each of the cells includes multiple heater elements and circuitry to selectively energize the heater elements. The printhead further includes at least one nozzle plate overlying the megachip, wherein the nozzle plate includes a plurality of nozzles and wherein each of the plurality of nozzles overlies a corresponding ink chamber which receives a supply of ink. A heater element corresponding to an ink chamber heats ink in the corresponding ink chamber. The plurality of cells are arranged so that a first cell is offset from a second cell to provide at least some relative overlap of the nozzles associated with the first cell in relation to the nozzles associated with the second cell.

Preferably, multiple single cell patterns of the invention are oriented in vertical alignment, but are offset horizontally such that subsequent columns of cells overlap the space between the vertical ones. In this manner, individual cells can be grouped and expanded to form a larger army of cells, as desired. The overlap allows the array to maintain its density of droplet spacing and permits the single patterns or individual banks to be separated into individual die, if necessary. This "mega" chip having multiple cells allows precision relative positioning of the cell patterns, since these cell patterns are established during wafer processing.

Other features and advantages of the invention may be determined from the drawings and detailed description of the invention that follows:

DETAILED DESCRIPTION OF THE PREFERRED EMBODIMENTS

Figure 1A:
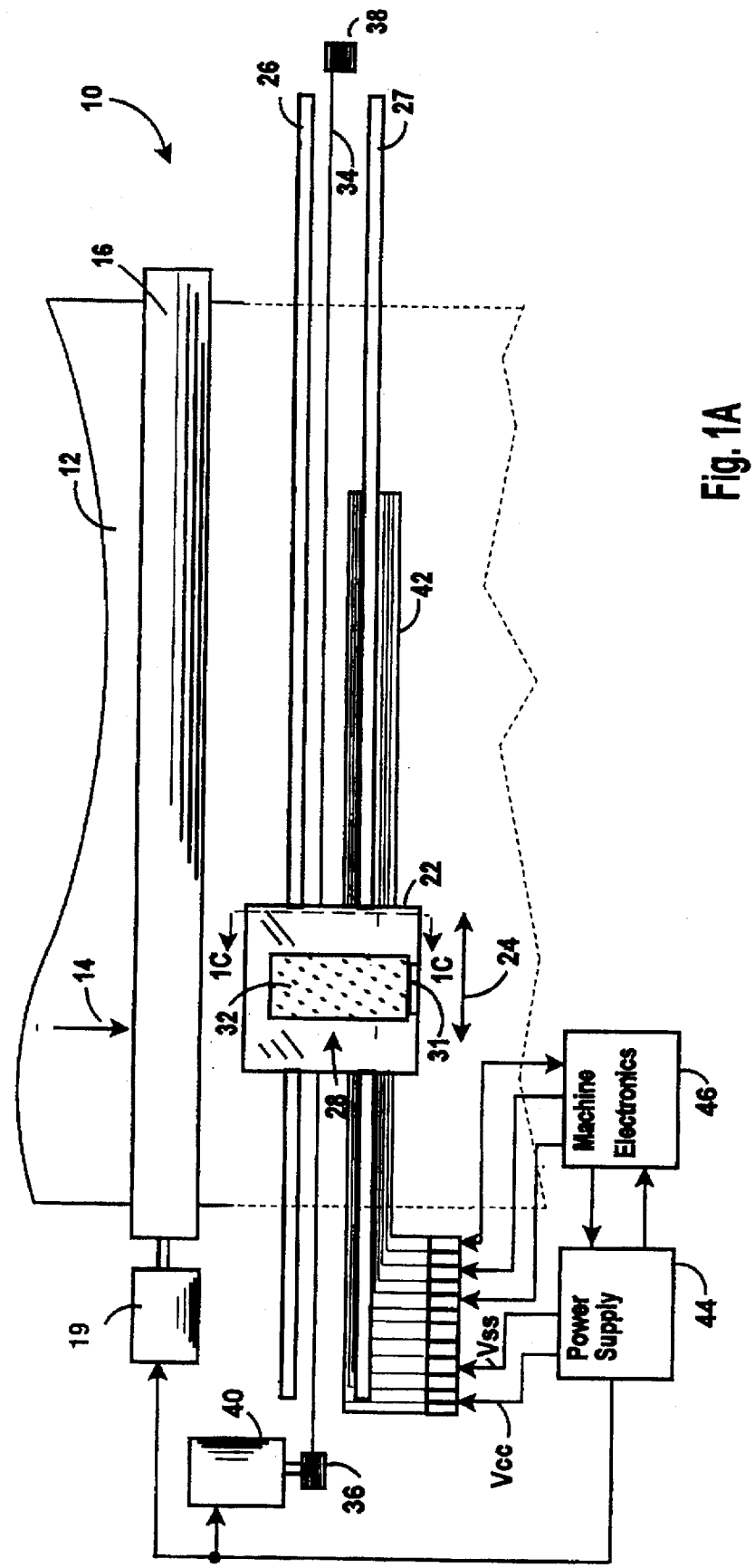
FIG. 1A is a schematic view in plan of a thermal ink jet printer for receiving an ink cartridge having a printhead to which the novel method and apparatus of the present invention pertains.

FIG. 1A illustrates an embodiment of an ink jet printer 10, only by way of example, to which the present invention is applicable. In FIG. 1A, a print receiving media 12, which is a recording medium made from paper, or thin film plastic and the like, is moved in the direction of an arrow 14, being guided by superimposed pairs 16, 18 of sheet feed rollers and under control of medium drive mechanism, in the present instance a drive motor 19.

Figure 1B:
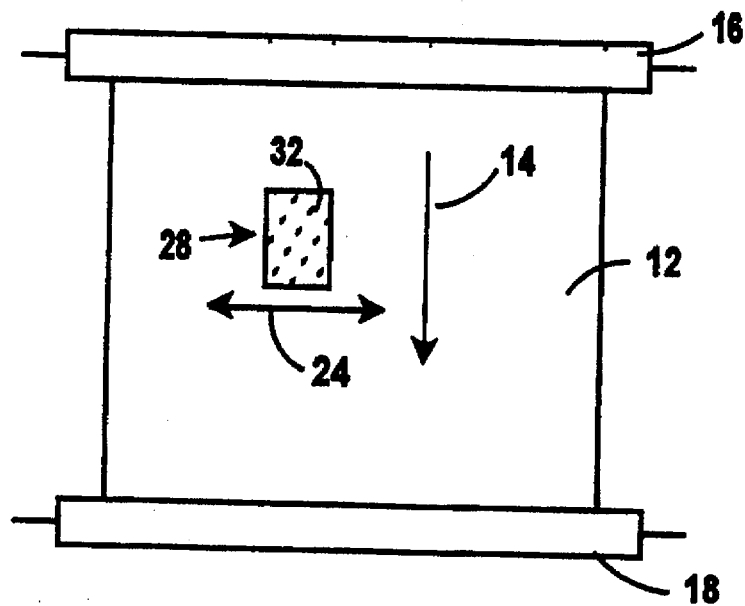
FIG. 1B is a schematic and fragmentary, reduced size view of a portion of the apparatus illustrated in FIG. 1A, and showing printhead and print receiving media relative motion.
Figure 2:
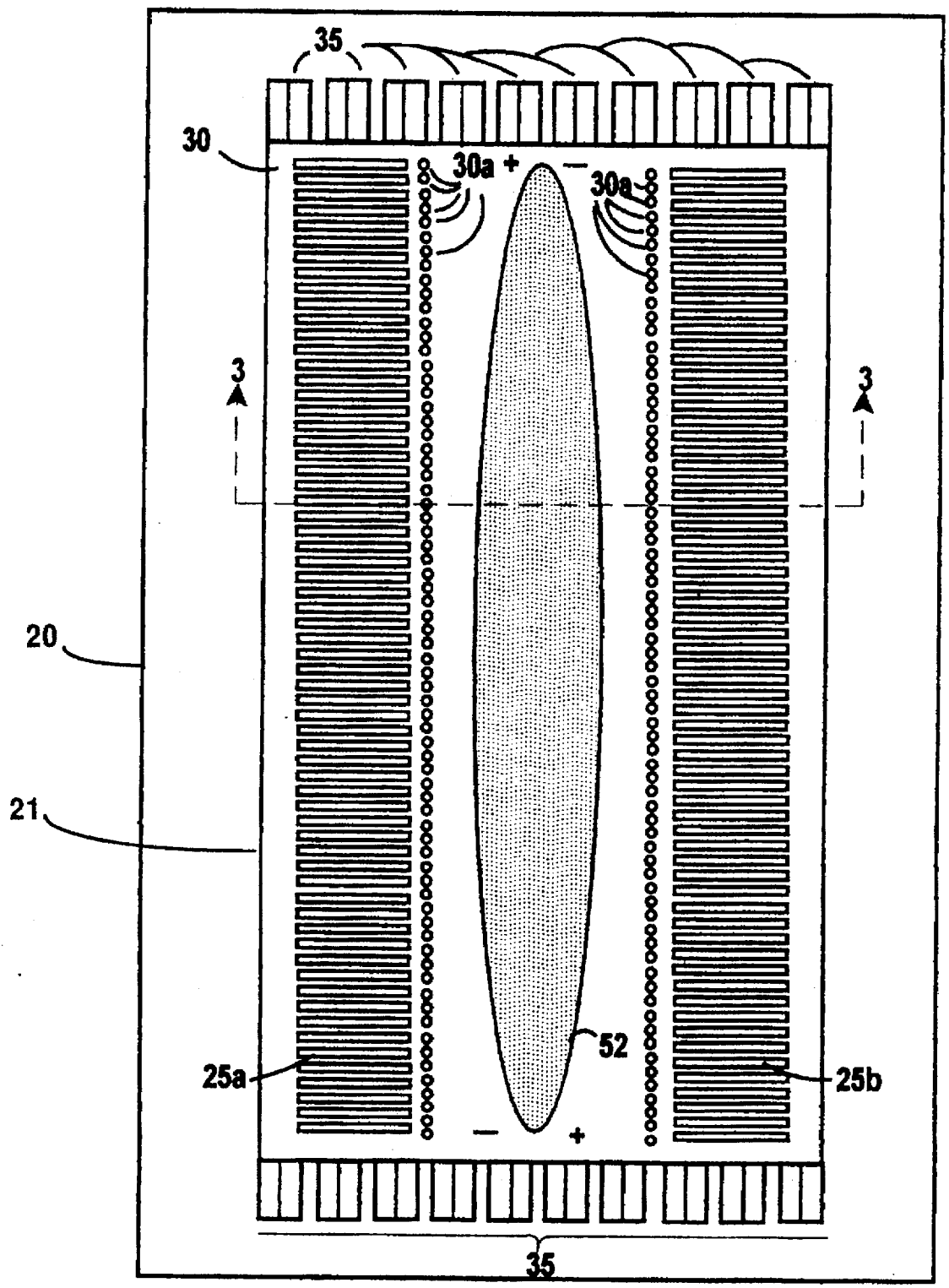
FIG. 2 is an enlarged schematic view in plan of a printhead having a nozzle plate viewed as transparent to show the relative position of a single bank or cell of electrical components positioned thereunder.

As shown in FIGS. 1A and 1B, a printing cartridge 28 is mounted on a carrier 22, which is carried in close proximity to a print receiving media 12, which in turn is transported by roller pairs 16, 18. As shown by the arrow 24, the cartridge 28 (and thus the printhead carrier 22) is mounted for orthogonal, reciprocatory motion relative to the print receiving media 12. To this end, and as shown in FIG. 1A, the carrier 22 is mounted for reciprocation along a pair of guide shafts 26, 27. Cartridge 28 includes a recording head unit, or printhead 29, which includes a chip 20 attached to a nozzle plate 30 having a plurality of individually selectable and actuable nozzles 30a (see FIG. 2 and 3) and includes a supply of ink in an ink holding reservoir 32, such as a tank or bottle. The nozzle plate portion 30 is preferably made of stainless steel (sometimes coated on opposite sides with gold and/or tantalum, for attachment to the thick film side) or a hard, thin and high wear resistant polymer layer. Nozzle plate 30 is shown in the drawings as being transparent to better view the silicon structure thereunder. A typical nozzle plate implemented in conjunction with the invention, however, would not be transparent. Ink ejection nozzles 30a in the nozzle plate 30 of the ink jet printhead 29 confront the prim receiving media 12, and ink may be ejected by thermally heating the ink in the nozzles, to effect printing on the print receiving media 12. It should be noted that the nozzles 30a shown in FIG. 2 are not to scale, and while a plurality are shown, the number is only by way of example.

The reciprocatory or side-to-side motion of the carrier 22 is established by a carrier drive, in the illustrated instance, having a transmission mechanism including a cable or drive belt 34 and pulleys 36, 38 which carry the belt 34 driven by a motor 40. In this manner, the print cartridge 28 may be moved and positioned at designated positions along a path defined by and under control of the carrier drive and machine electronics 46.

Figure 1C:
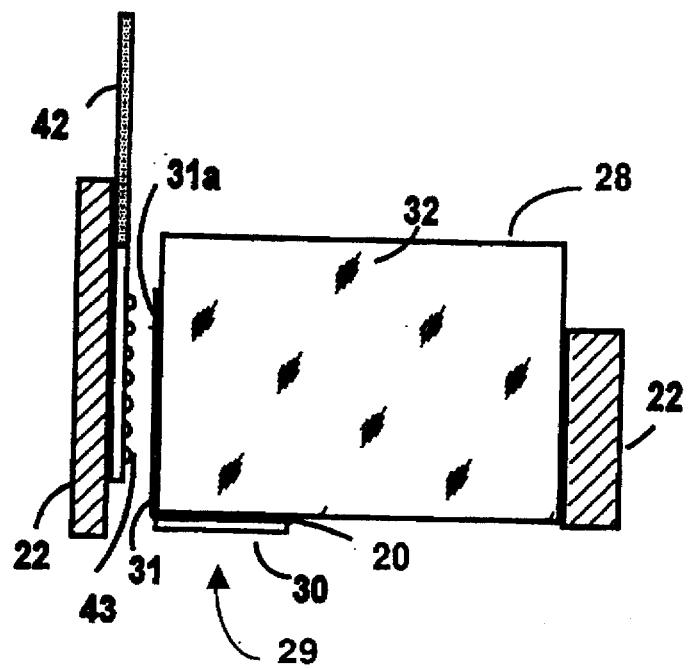
FIG. 1C is an enlarged, partially exploded, fragmentary sectional view of a portion of the apparatus shown in FIG. 1A, taken along line 1C—1C of FIG. 1A.

The carrier 22 and the cartridge 28 are connected electrically by a flexible printed circuit cable 42 for supplying power from the power supply 44 to cartridge 29, and to supply control and data signals to cartridge 29 from the machine electronics 46, which includes the primer control logic (PCL). As illustrated in FIG. 1C, the nozzle plate 30 is bonded to chip 20 which in turn is bonded to the reservoir 32. The chip I/O, including control signals and power, is applied through TAB circuit 31 and spaced apart integrated lands 33 therein (see FIGS. 1C, 5 and 6) for making I/O (including electrical) connection to the chip 20. In the illustrated instance, the tape 31 extends along one surface of the reservoir 32 with terminal pads 31a (see FIG. 5) therein for mating engagement with terminal protrusions or projections 43 (see FIG. 1C) on the flexible printed circuit cable 42. For ease of illustration and understanding, the portion of the carrier 22 carrying the flexible printed circuit cable 42 and its protruding electrical connections 43 is shown spaced from the terminal pads 31a of the TAB circuits or tape 31. Upon insertion of the cartridge 28 into the carrier 22, however, electrical mating engagement occurs between the terminal pads 31a of tape 31 and the protrusions or projections 43 of the flexible printed circuit cable 42. There are numerous techniques for engagement between the contacts 43 and the pads 31a, including sliding frictional engagement, and any such technique is acceptable as long as static discharge between the two connections is minimized or avoided during mating engagement or interconnection.

In the above structure, when printing occurs, simultaneously with a movement of the carrier 22 in the direction of the arrow 24 in FIG. 1 A, the electro-thermal converting element (resistor), associated with each nozzle 30a, is driven selectively in accordance with recording data so that ink droplets eject from the nozzles 30a in the nozzle plate 30 and impinge upon the surface of the print receiving media 12, wherein the ink drops form the recording information on the print receiving media 12.

FIG. 2 is a greatly enlarged, schematic representation of an Integrated Circuit (IC) chip 20, having a bank or cell 21 of electrical components, which forms part of printhead 29. In real measurement terms, chip 20 is approximately ⅓" (~8.5 mm) by ⅛" (~2.8 mm). Chip 20 is one of many cut from, in a conventional manner, a silicon wafer which has been coated with photo resist, photo lithographically exposed through a mask, subjected to an etch bath and doped by processes well known in the an of semiconductor manufacturing. The process is repeated through several layers, including metalization for I/O pads 35, usually making multiple integrated circuit chips on a single wafer, which is then cut or diced, into individual chips, or dies.

Figure 3:
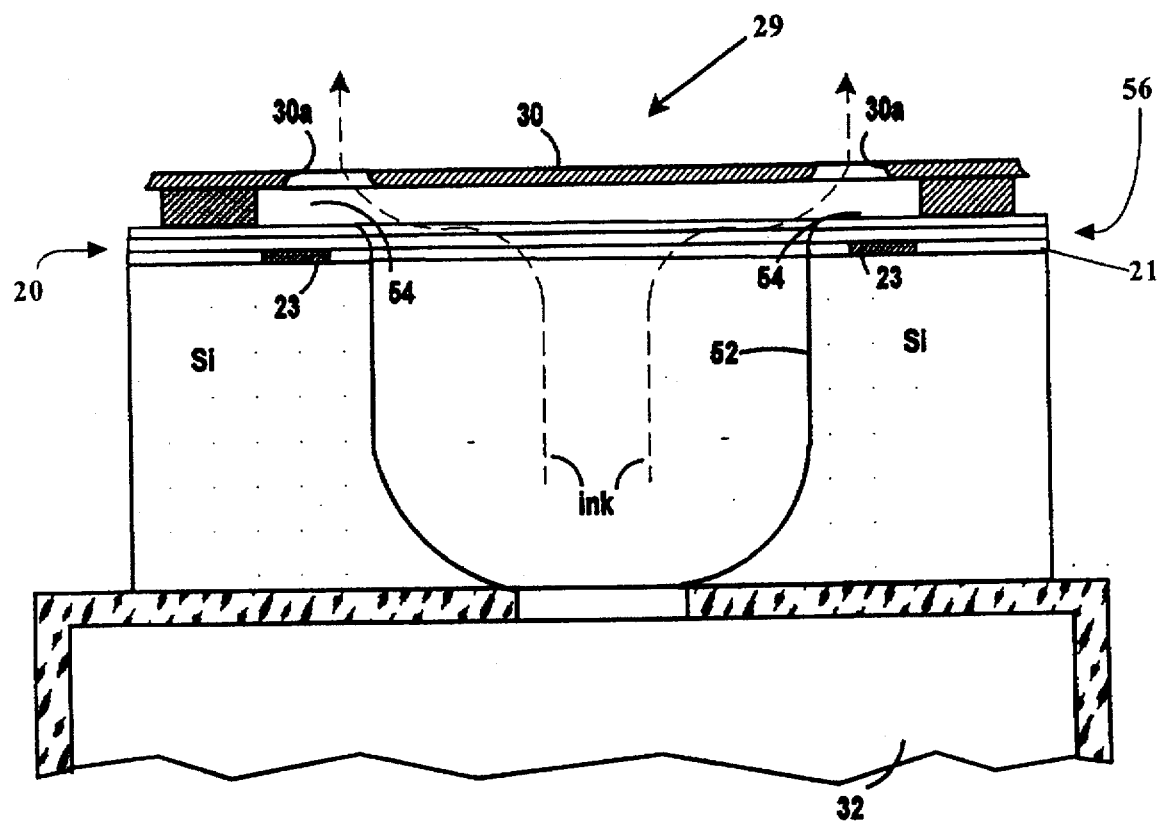
FIG. 3 is an enlarged, fragmentary cross sectional view taken along line 3—3 of FIG. 2.

As shown in FIG. 3, cell 21 of chip 20 includes electrical components, such as resistors 23 and active circuits 25a and 25b. Resistors 23 are preferably arranged in longitudinally extending arrays, wherein one resistor is associated with each nozzle 30a. Each resistor is connected to an active circuit 25a or 25b comprising, for example, a field effect transistor (FET), arranged, as shown in FIG. 2, on opposite sides of the arrays of resistors 23 (shown in FIG. 3). The FETs are represented by two columns 25a, 25b. The active circuits may be arranged e.g. in a matrix and include data lines and address lines. I/O pads 35, along the periphery of the chip 20, may be connected to an address and data line bus (not shown) in the chip.

As shown in FIG. 3, chip 20 includes a via or vias 52 through the silicon to allow the passing of ink from ink reservoir 32 behind the chip into the channels or chambers 54 over the heater resistors 23. The vias 52 may be cut by means of grit blasting or laser cutting. The channels or chambers 54 may be formed in conjunction with and as defined by the nozzle plate 30 and a thick spacer or insulating film 56. The thick film layer 56 may be etched to expose the heater resistor 23, which may include a protective metal over the heater resistors 23, thus placing the resistors 23 beneath the ink channels. Alternatively, the ink channels and nozzles may be created from a single polymer material as known in the art. Such a polymer nozzle plate, however, would include slots or openings to expose electrical connection points, such as pads 35. As shown in FIG. 3, the ink flows from the via hole 52 into the channels 54 and out through the nozzles 30a, as illustrated by the arrows.

In accordance with the invention, as illustrated in FIGS. 4-8, a single large megachip containing multiple cells or banks 21 is formed in which at least a pair of overlapping, horizontally displaced cells 21 are cut from a single semiconductor wafer. It should be understood that, in general, elements shown in FIGS. 2-8 which are functionally equivalent are identified using common element numbers. For example, cell 21 of FIG. 2 is substantially identical to cells 21 of FIGS. 4-8.

Figure 4:
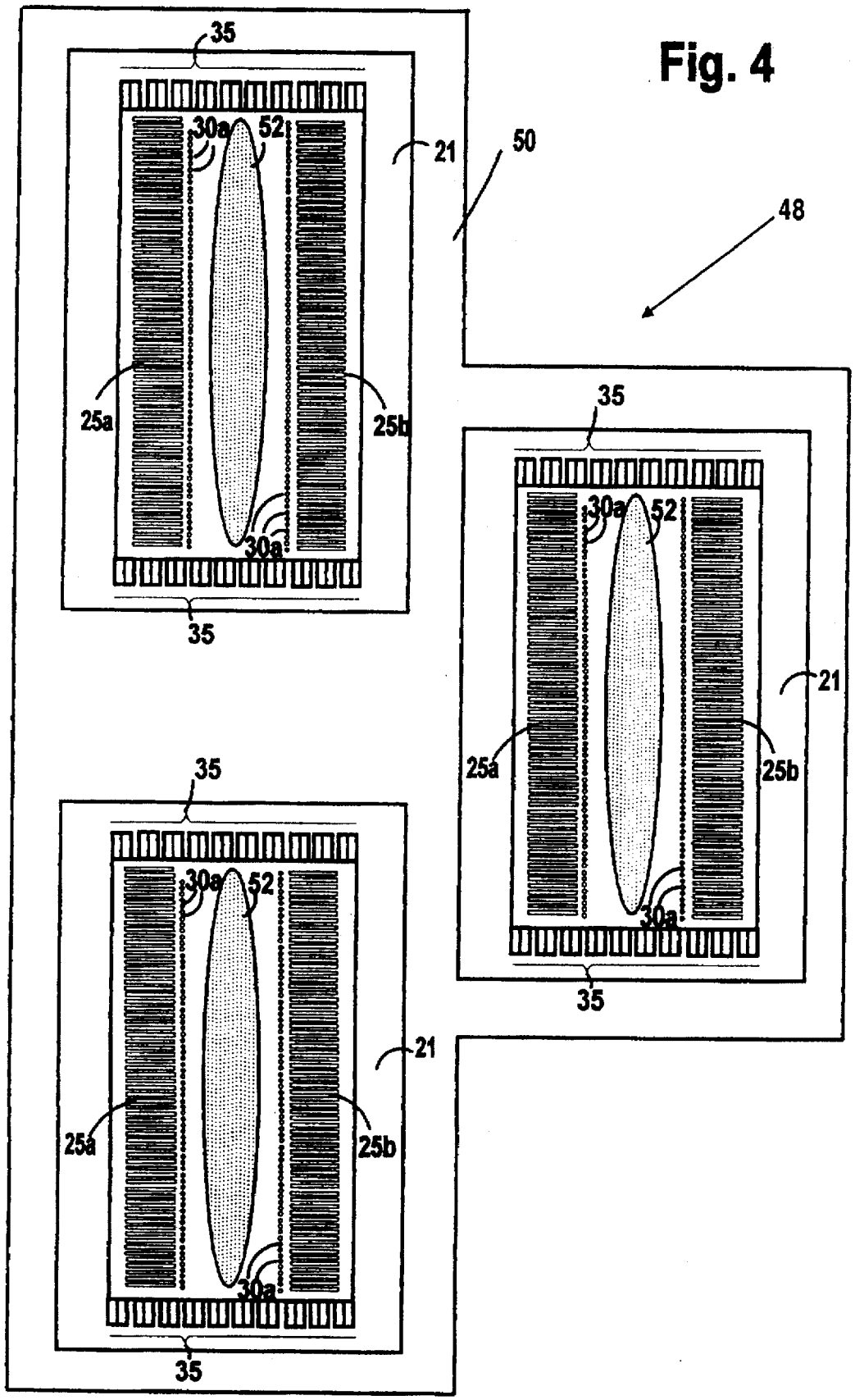
FIG. 4 is an enlarged, schematic representation of a printhead formed from multiple cells on a single semiconductor chip forming, in accordance with the invention, a megachip.
Figure 7:
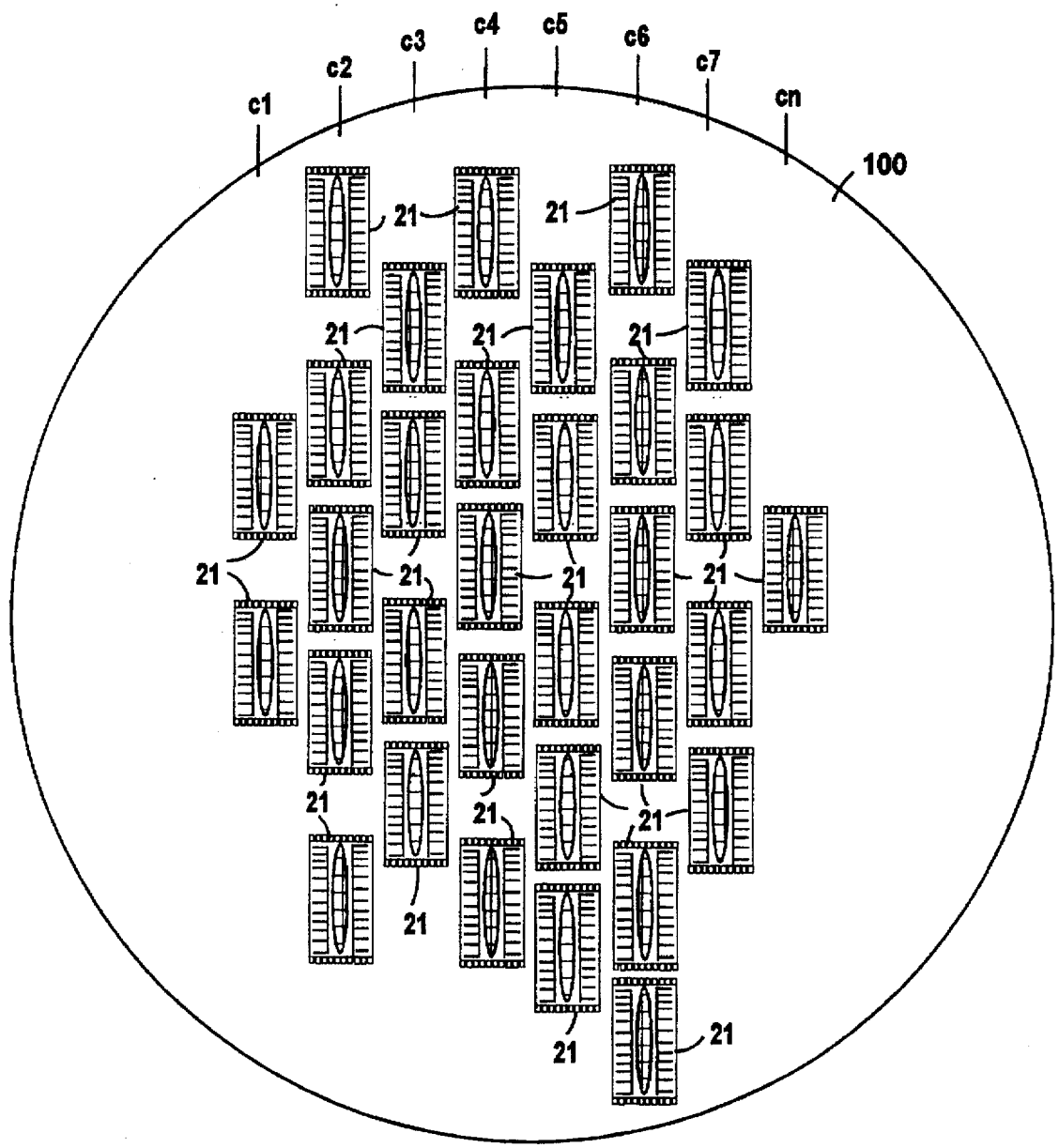
FIG. 7 is a partial schematic representation of a silicon wafer incorporating the layout of multiple cells of heaters and associated semiconductor matrix arrays therefor.
Figure 8:
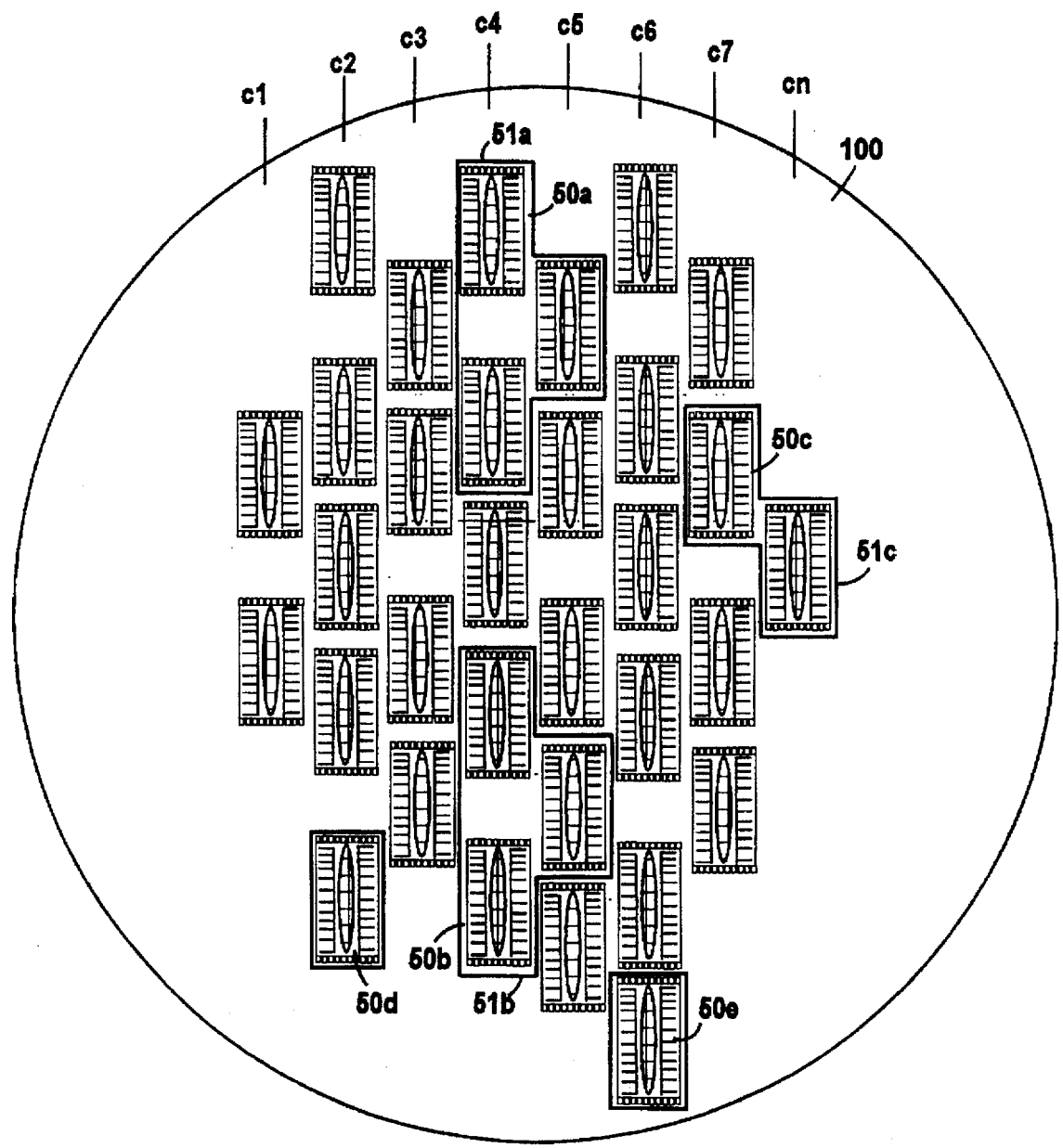
FIG. 8 is a view similar to FIG. 7, but illustrates the manner of defining both megachip structures having multiple cells of heater and active semiconductor arrays and single chip structures having a single cell.

FIG. 4 illustrates a partial view of a printhead 48 including a single chip, or megachip 50, having multiple silicon cells or banks 21 which has been extracted from a semiconductor silicon wafer by dicing a single silicon substrate 100 (see FIGS. 7 and 8). Megachip 50 is covered with a nozzle plate 30, which includes nozzles or orifices 30a for the expulsion of ink. Nozzles 30 a may be provided by a single nozzle plate covering all the cells or banks 21 of megachip 50, or may be comprised of multiple nozzle plates corresponding to the number of cells 21. The cells 21 are substantially identical and correspond generally to cells 21 illustrated in FIG. 2.

The number of individual cell patterns comprising megachip 50 will depend in part upon the number of heater resistors 23 in each of the individual cells 21. Other considerations for the choice of the number of individual cell patterns include structural strength and yield considerations. A choice of three cell patterns provides more structural strength than two in columnar alignment, but two that are adjacent but columnarly offset with overlap are also stronger than two cells that are aligned in a column. While megachips with additional cells are also possible, and may even be desirable in certain requirements for extremely high resolution, additional cell requirements become expensive due to a concomitant decrease in yield.

Any known silicon technology method may be employed for fabrication of the silicon cells. The active circuits (FETs 25a and 25b) and the passive elements (such as the heater resistors 23) may all be formed on each silicon cell 21 on the megachip 50 by typical large scale integrated circuit techniques as is known by those skilled in the art. Example manufacturing techniques are taught in U.S. Pat. No. Re 32,572 to Hawkins, et al., and U.S. Pat. No. 5,000,811 to Campunelli, et al.

Figure 5:
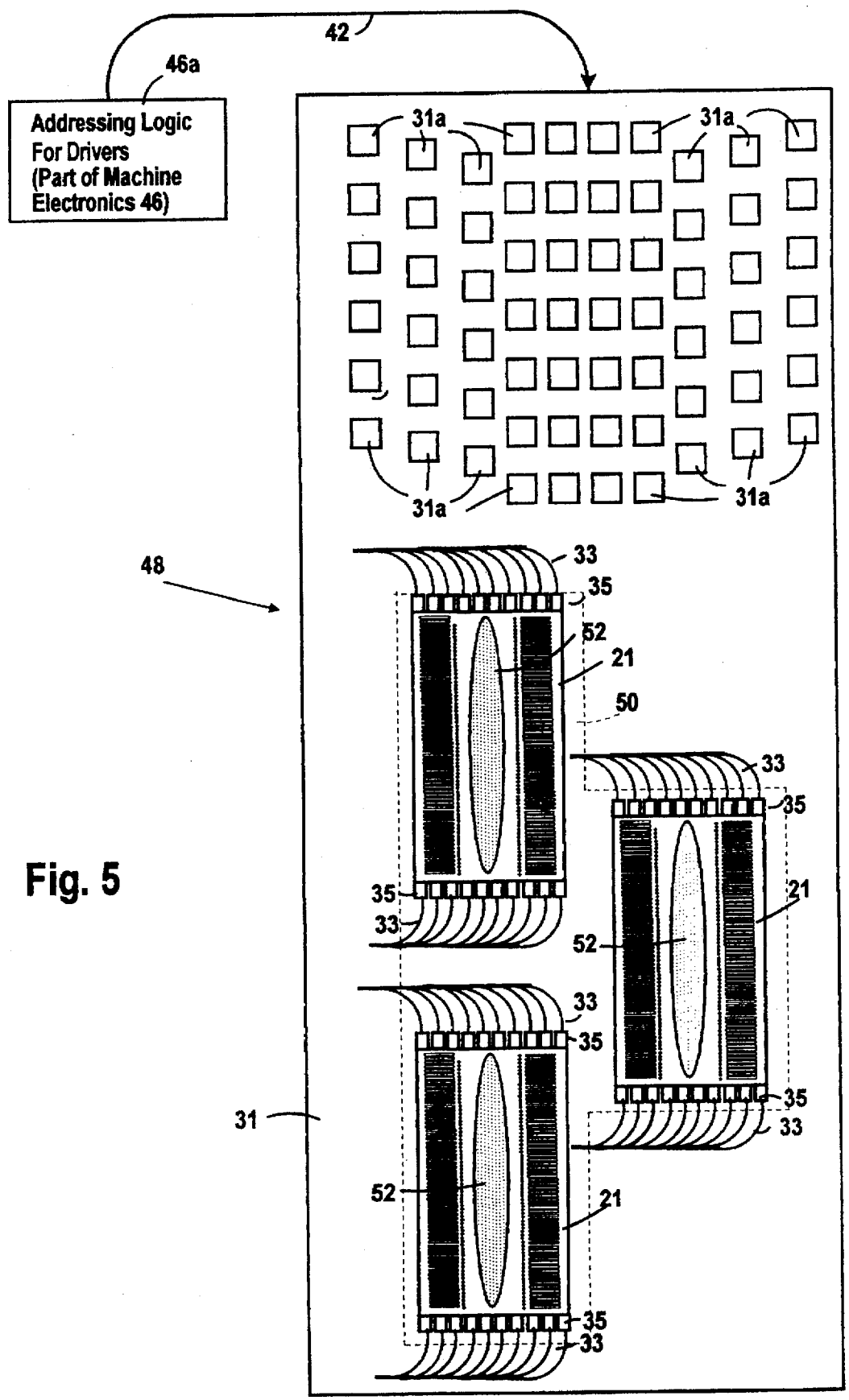
FIG. 5 is a schematic representation of a megachip that has been bonded to tape by tape automated bond (TAB) media and illustrating schematically the connection made between cells and tabs or electrode type connections on the media for connection to external drivers and addressing logic of the machine of FIG. 1A, and more specifically for mounting on the ink reservoir, or tank, to form a printhead as illustrated in FIG. 1C.
Figure 6:
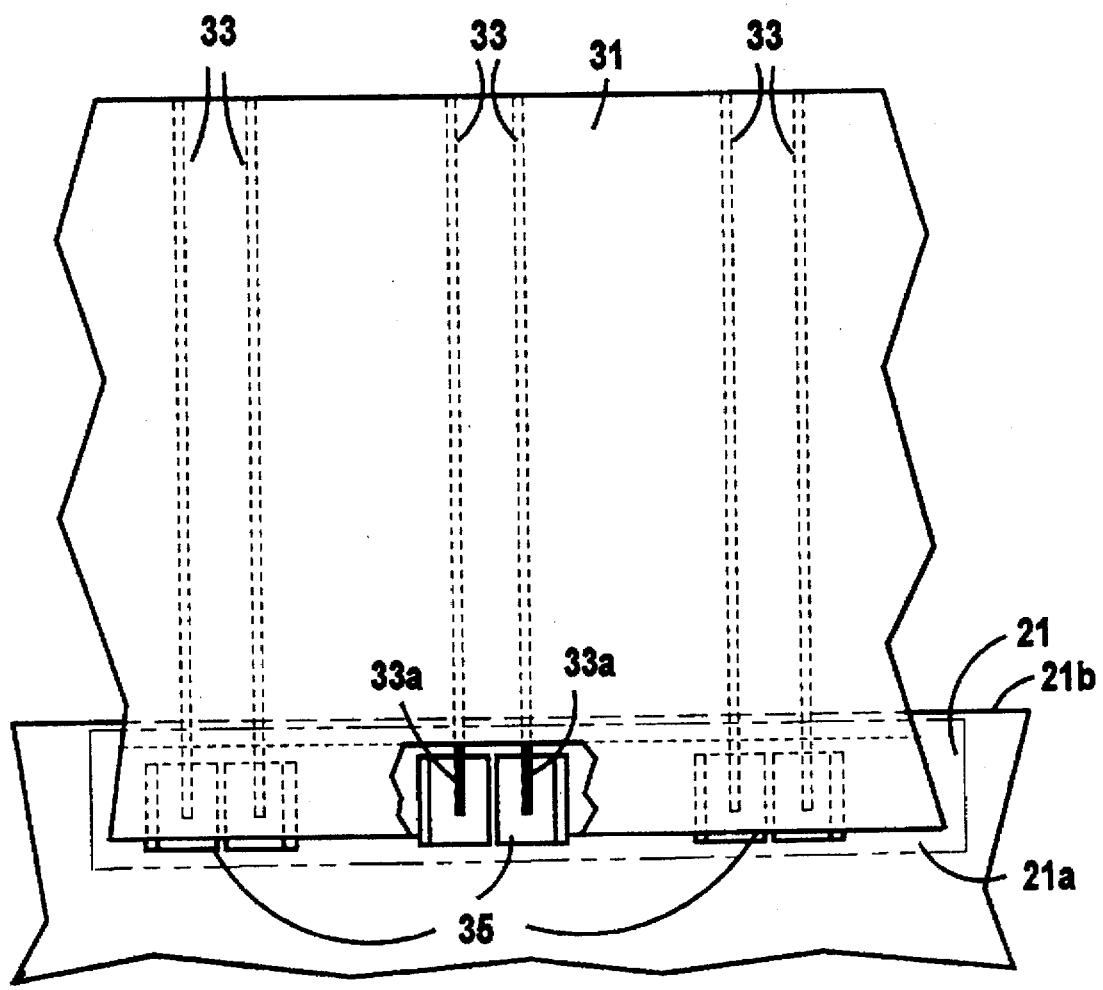
FIG. 6 is a fragmentary, enlarged, view in plan of TAB circuitry connected to the megachip of FIG. 4.

Turning now to FIGS. 5 and 6, and especially FIG. 5, the TAB circuitry or tape 31 is schematically shown in a position relative to the megachip 50. In the tape automated bonding process (TAB), the tape 31 is formed with multiple cutouts or openings to receive megachip 50, with enough space therebetween to permit bonding of the beam ends of lands 33 to selected, individual pads of the pads 35. The position of the megachip 50 relative to the tape 31 is shown in dotted or hidden lines. The lands 33 in the tape are connected to the terminal pads 31 a or, depending upon the ink jet head configuration, may include a cell interconnection scheme depending upon the desire of the machine designer for parallel operation of selected nozzles or independent control of each nozzle. The terminal pads 31a are in turn engaged with the protrusion 43 of FIG. 1C of circuit 42 for electrical coupling to machine electronics 46. (See FIGS. 1A and 1C).

FIG. 6 is a fragmentary, enlarged, view in plan of a portion of TAB circuitry or tape 31 connected to the chip 21 of FIG. 2. As shown, the extended beam ends 33a of the lands 33 are bonded to individual pads 35 of cell 21. The area 21a (bounded by phantom lines) along the edge 21b is conventionally covered by an encapsulant, such as potting compound, to inhibit ink bridging (and therefore shorts) between the beams 33a and the chip I/O pads 35.

FIG. 7 is a partial schematic representation of a silicon semiconductor wafer 100 incorporating the layout of multiple banks or cells 21 of heater and active semiconductor matrix arrays. As previously described, the multiple silicon cells 21 are positioned in a line vertically, but are offset horizontally such that, for example, the cells of a first column overlap the space between cells of an adjacent column. In this manner, multiple cells form a megachip and the number of cells can be expanded as desired to form larger arrays. To this end, the individual cell layout in the wafer has deliberately been expanded to increase spacing at appropriate or selected intervals, and is dependent upon the particular design of a megachip 50 desired. For example, the cell layout may be uniform with small row spacing between the cells 21 in the columns c1, c2, c3 . . . cn, but with adjacent columns being offset so that the columns of dies are overlapping such that each cell in an adjacent column overlaps two of the cells in its previous adjacent column. With a megachip 50 layout or design of three cells 21, such as shown in FIG. 4, the columns may be laid out in the manner illustrated in FIG. 7, or as suggested above, the cell spacing in each column may be uniform, depending upon the megachip 50 design. The design requirement, simply stated, is based upon the amount of cell or nozzle overlap needed or desired. If the design layout is as shown in FIG. 4, the overlap is about ⅓, i.e. the cell overlap between the cells in adjacent columns of the megachip is approximately ⅓. The overlap is only critical to the resolution and coverage desired by the designer. For example, such overlap may result in increased resolution by horizontally interleaving the nozzles associated with a first cell with the nozzles associated with a second cell.

FIG. 8 shows an army of cell patterns structured such that a laser selective cutting process can be performed. The selective cutting process begins with testing and a yield study of the silicon cells 21. Then an optimum arrangement is determined for dicing the cells 21. As shown in FIG. 8, three cell megachips, 50a, 50b are designated or selected (by way of example only) for dicing as by the heavier megachip outline. Of course many more megachip, multi-cell structures could be selected. For example, megachip 50c, as shown by the heavier megachip outline 51c, includes two cells 21 instead of three. Preferably, the selective cutting process is performed by a laser dicing tool, but other suitable die cutting methods may be employed, as is known in the art.

The designated number of cells for the megachip may be cut as one unit if the yield is appropriate, or they may be cut into individual chips if an individual cell cannot be grouped with an adjacent cell. The alignment or fiducial marks (+−), as shown for example in FIG. 2, may be employed for proper alignment of the nozzle plates and the individual chips relative to one another.

Some of the cells 21 may be indicated as "good", i.e. completely functional and of acceptable quality, in accordance with their initial tests, but an adjacent cell, for example, near the periphery of the wafer 100, may not be of sufficient yield or quality to allow its use in a megachip. In such a case, "good" chips, such as chips 50d and 50e, may be extracted and employed in single ink jet printheads for a low end design, or may be mated in overlapping relation (such as the cell pattern of chip 50c) to form a megachip. As several possible combinations of silicon cells may result in megachips, the effective yield of a silicon wafer is improved.

Thus, prior to the present invention, a single chip of similar size as the megachip would be completely lost, or wasted, if part of it failed to perform. With the megachip concept, if one of the silicon cells 21 in the megachip does not satisfactorily perform, the other two are salvageable as separate chips for use individually on printheads, or may be regrouped into a different unitary megachip combination.

An advantage of the unitary, or single cutout, multi-cell megachip over separate chips is that the alignment of the silicon cells in the megachip is more precise than a bonding alignment because the silicon cells are processed together on the wafer, and the tolerances involved are predominantly the wafer fabrication tolerances. Thus, precision relative positioning of the heater elements among silicon cells can be accomplished.

An additional enhancement to this concept may include a wiring connection scheme between single cell patterns, such that common connections are made on the megachip to reduce the total number of off chip connections needed on the TAB bonder. Accordingly, some cell-to-cell wiring on the megachip with the metalization fabrication stages already utilized in the processing of the megachip is possible. In embodiments which include a polymer nozzle plate, slots or openings may be formed therein to expose electrical connection points associated with such cell-to-cell wiring.

As a result of the invention, exact positioning of cells 21 relative to one another on a unitary multiple cell "mega" chip is achieved. Such a megachip is preferably formed near the center of the silicon wafer where yield is high, and increased nozzle resolution per die may be realized. For example, resolution of 1000 or more heaters per chip capacity may be achieved. Single cells, or banks, may be formed (or salvaged) on the die near the wafer edges where yields are lower, and such single banks or cells may be employed where very high resolution may not be a prime factor, or may be combined to form megachips.

Although the invention has been described with reference to preferred embodiments, those skilled in the art will recognize that changes may be made in form and in detail without departing from the spirit and scope of the following claims.

What is claimed is:

1. A method of manufacturing ink jet printhead dies, comprising the steps of:
   processing a silicon wafer to establish a plurality of substantially identical individual cells having electrical components formed therein;
   defining a first die having multiple cells in at least a first portion of said silicon wafer;
   defining at least a second die in a second portion of said silicon wafer, said second die having a quantity of cells different from the number of cells included in said first die; and
   dicing said wafer to separate said first die and said at least said second die from a remainder of said silicon wafer.

2. The method of claim 1, wherein said processing step further comprises the steps of:
   arranging said plurality of individual cells in a plurality of columns in said silicon wafer,
   wherein cells comprising a first column are vertically offset from cells comprising an adjacent column.

3. The method of claim 2, wherein said first column includes at least two cells vertically arranged and said adjacent column includes at least one cell.

4. The method of claim 1, further comprising the steps of:
   testing each cell on said wafer;
   determining which, if any, of said plurality of individual cells on said wafer are completely functional; and
   dicing said wafer to form said first die from a plurality of said completely functional cells.

5. The method of claim 4, wherein said completely functional cells are arranged such that at least one cell is offset from another cell, whereby said one cell in combination with said another cell forms an overlapping cell structure in one plane.

6. The method of claim 1, further comprising the step of combining multiple individual dies diced from said wafer to form a single printhead chip.

7. The method of claim 1, wherein said second die comprises a single cell.

8. The method of claim 1, further comprising the step of providing wiring connections between individual cells so as to form common connects therebetween.

9. The method of claim 8, wherein said wiring connections are formed during a metalization of said wafer.

10. An ink jet printhead, comprising:
    a unitary megachip comprising a plurality of cells, wherein each of said cells comprise multiple heater elements and circuitry to selectively energize said heater elements;
    a layer forming a plurality of ink chambers; and
    at least one nozzle plate overlying said megachip, said nozzle plate including a plurality of nozzles, wherein each of said plurality of nozzles overlies a corresponding ink chamber which receives a supply of ink, and wherein each heater element corresponds to a respective ink chamber for heating ink in the corresponding chamber, said plurality of cells being arranged so that a first cell is positioned offset from a second cell to provide at least some relative overlap of the nozzles associated with said first cell in relation to the nozzles associated with said second cell.

11. The ink jet printhead of claim 10, wherein said overlap results in said nozzles associated with said first cell interleaving said nozzles associated with said second cell.

12. The ink jet printhead of claim 10, wherein at least two of said plurality of cells are arranged in a column.

13. The ink jet printhead of claim 10, further comprising a third cell, wherein said third cell is aligned in column with one of said first cell and said second cell and spaced vertically therefrom.

14. An ink cartridge including the printhead of claim 10, comprising an ink supply connected to said megachip, and wherein a via is formed in said chip to connect said ink supply to each of said plurality of ink chambers.

15. The ink cartridge of claim 14, wherein said ink supply includes an ink container bonded to one planar side of said chip, said nozzle plate being connected to the other planar side of said chip, and further comprising:

a tape having conductive lands which provide I/O connection and electrical power to said chip; and means on said tape for effecting displaceable electrical connection to an ink jet printer.

16. A method of manufacturing chips for use in ink jet printheads, comprising the steps of:

processing a silicon wafer to form a plurality of cells having electrical components, said plurality of cells being arranged in a plurality of columns, wherein a first group of cells comprising a first column are positioned to be offset from a second group of cells comprising a second column;

defining a first die in which at least one cell is selected from each of two adjacent columns of cells; and dicing said wafer to separate said first die from said wafer.

17. The method of claim 16, wherein said first die is formed in a high yield area of said silicon wafer.

18. The method of claim 16, wherein said first die comprises at least three cells.

19. The method of claim 16, further comprising the steps of:

defining a second die consisting of a single cell; and dicing said wafer to separate said second die from said wafer.

* * * * *